United States Patent
Gong et al.

(10) Patent No.: US 8,520,407 B2
(45) Date of Patent: Aug. 27, 2013

(54) CABLE MANAGEMENT MECHANISM

(75) Inventors: Xin-Hu Gong, Shenzhen (CN); Si-Wen Shu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 153 days.

(21) Appl. No.: 13/107,952

(22) Filed: May 15, 2011

(65) Prior Publication Data

US 2012/0241187 A1 Sep. 27, 2012

(51) Int. Cl.
*H02G 3/04* (2006.01)
*H02B 1/20* (2006.01)

(52) U.S. Cl.
USPC ......... 361/826; 174/72 A; 174/68.1; 361/828; 361/728

(58) Field of Classification Search
USPC ............... 361/727, 826, 827, 828, 728, 730; 211/26; 174/50, 68.3, 72 A, 68.1; 385/134, 385/135
See application file for complete search history.

(56) References Cited

U.S. PATENT DOCUMENTS

| | | | | |
|---|---|---|---|---|
| 4,153,087 A | * | 5/1979 | Stoychoff | 294/106 |
| 4,794,490 A | * | 12/1988 | Epstein | 361/827 |
| 6,423,898 B1 | * | 7/2002 | Croker | 174/50 |
| 6,809,258 B1 | * | 10/2004 | Dang et al. | 174/50 |
| 7,022,916 B1 | * | 4/2006 | Cavanaugh et al. | 174/72 A |
| 7,200,931 B2 | * | 4/2007 | Clark et al. | 29/868 |
| 7,677,400 B2 | * | 3/2010 | Bayazit et al. | 211/26 |
| 7,840,111 B2 | * | 11/2010 | Elisson et al. | 385/135 |
| 8,193,448 B2 | * | 6/2012 | Syed | 174/68.1 |
| 8,344,247 B2 | * | 1/2013 | Sayres | 174/50 |

* cited by examiner

*Primary Examiner* — Angel R Estrada
*Assistant Examiner* — Dimary Lopez
(74) *Attorney, Agent, or Firm* — Altis Law Group, Inc.

(57) ABSTRACT

A cable management apparatus for managing a switch cable includes a mounting bracket, a resilient member fixed to the mounting bracket, and a number of positioning members mounted to the mounting bracket. The switch cable is positioned between the resilient member and the positioning members, and stretched by the resilient member, thereby extending sinuously along a lengthwise direction of the mounting bracket. A rear end of the switch cable is retained to the mounting bracket.

5 Claims, 4 Drawing Sheets

CABLE MANAGEMENT MECHANISM

BACKGROUND

1. Technical Field

The present disclosure relates to a cable management mechanism.

2. Description of Related Art

An electronic device, such as a server, generally includes a power module to distribute electrical power to function components of the electronic device. For easy manipulation, the power module is mounted to a chassis of the server, accessible from a front end of the chassis, and connected to a power source with a switch cable extending out of the chassis. However, the switch cable may interfere with the function components in the chassis if the switch cable is not properly arranged.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
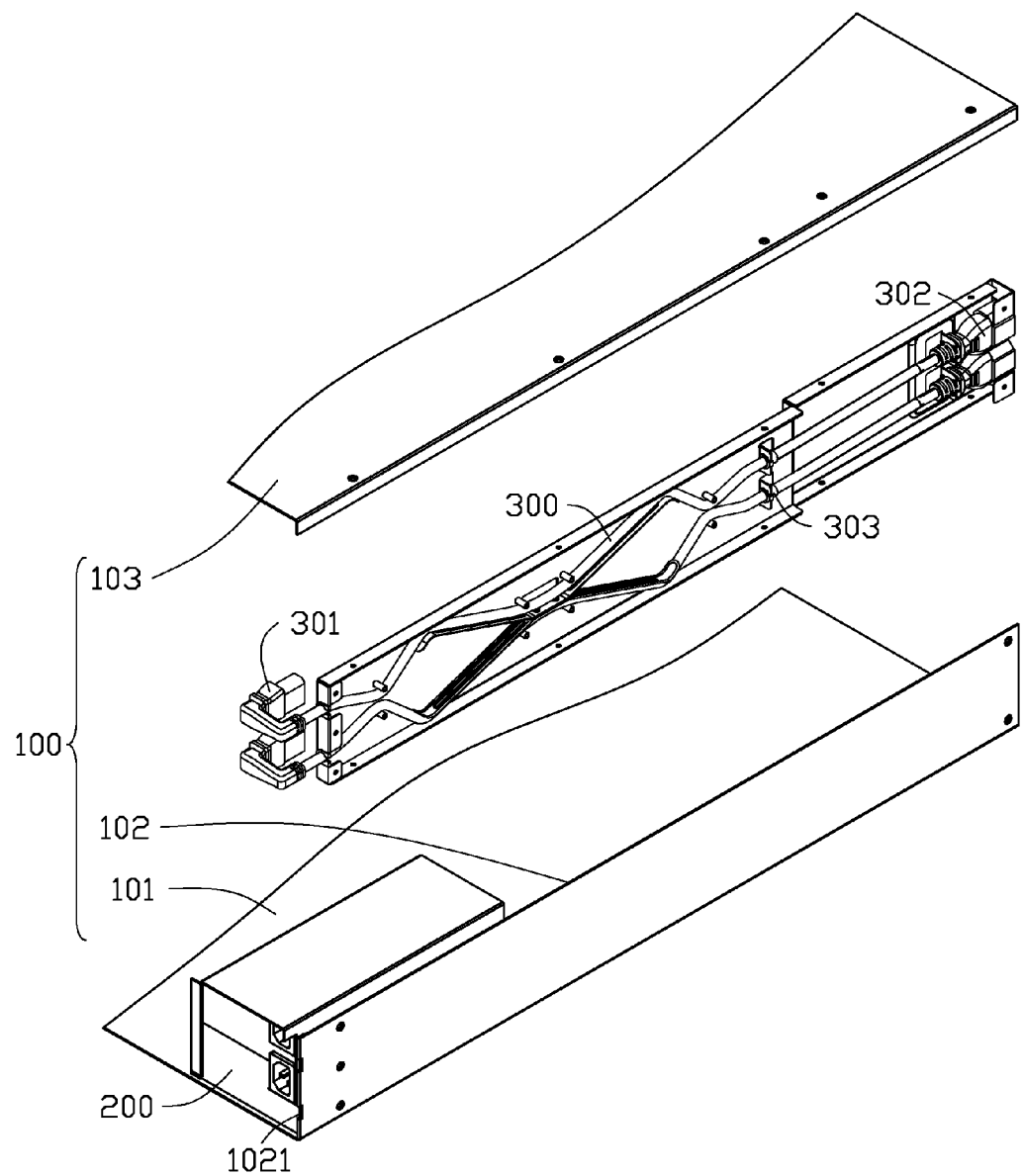
FIG. 1 is an exploded, isometric view of an embodiment of a cable management mechanism, including two switch cables and a chassis.

Referring to FIG. 1, an exemplary embodiment of a cable management mechanism is mounted to a chassis 100 of a server, to manage two switch cables 300.

The chassis 100 includes a base and a cover 103. The base includes a bottom wall 101, and a sidewall 102 perpendicularly extending from a side of the bottom wall 101. Two notches 1021 are defined in a front end of the sidewall 102. The bottom wall 101 defines a plurality of through holes (not shown in the drawings) adjacent to the sidewall 102. The sidewall 102 also defines a plurality of through holes (not labeled). The cover 103 defines a plurality of through holes (not labeled) adjacent to a side of the cover 103.

Each of the switch cables 300 includes a first connector 301 and a second connector 302 at opposite ends of the switch cable 300. A positioning ring 303 is fixed about the switch cable 300. The first connector 301 is substantially U-shaped.

Figure 2:
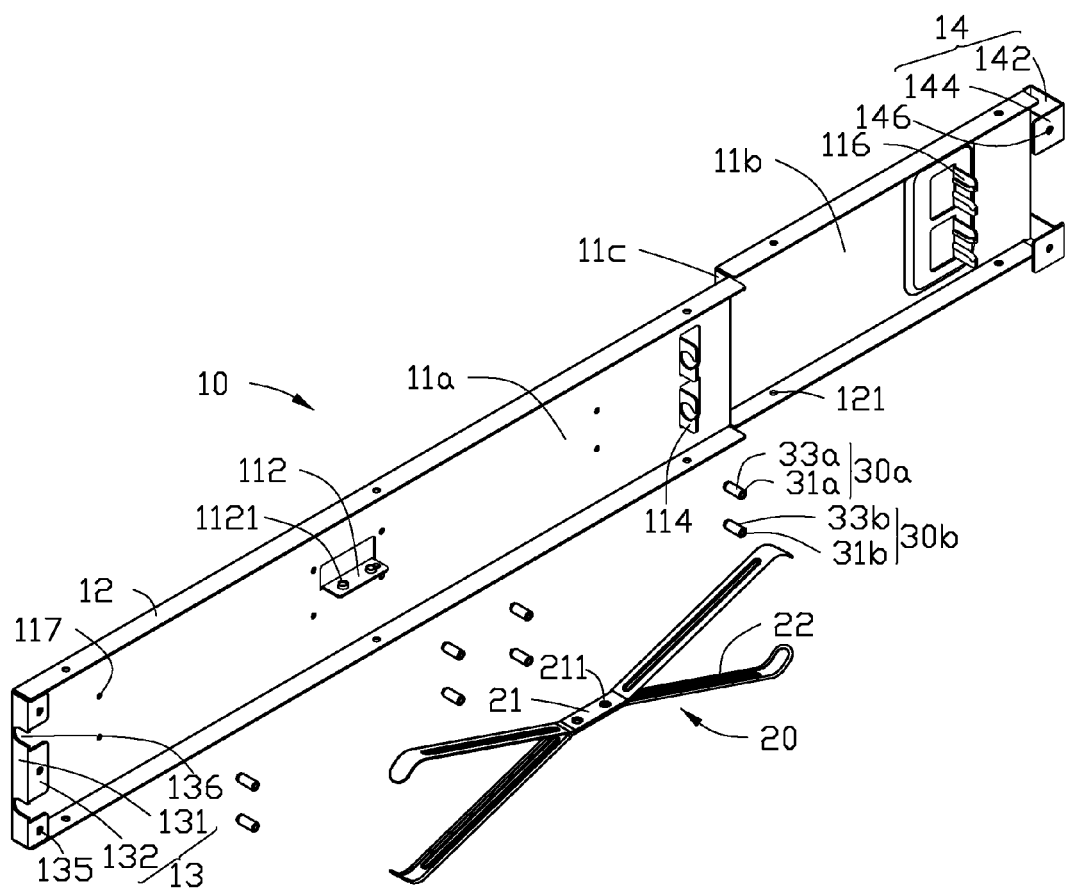
FIG. 2 is an exploded, isometric view of the cable management mechanism of FIG. 1.

Referring to FIG. 2, the cable management mechanism includes a mounting bracket 10, a resilient member 20, four first guiding members 30a, and four second guiding members 30b.

The mounting bracket 10 includes a first side plate 11a, a second side plate 11b parallel to and away from the first side plate 11a, and a connecting portion 11c perpendicularly connected between a rear end of the first side plate 11a and a front end of the second side plate 11b. Two fixing plates 12 perpendicularly extend from top and bottom sides of each of the first side plate 11a and the second side plate 11b. The width of each of the fixing plates 12 is slightly greater than the diameter of each of the switch cables 100. Three substantially L-shaped front end plates 13 extend from a front end of the first side plate 11a. Two fixing units 14 extend from a rear end of the second side plate 11b, and are respectively adjacent to top and bottom of the second side plate 11b. A tab 112 perpendicularly extends from a middle of the first side plate 11a, and is parallel to the fixing plates 12. Two connecting holes 1121 are defined in the tab 112. Two retaining rings 114 extend from the first side plate 11a, and are adjacent to the second side plate 11b, respectively above and below the tab 112. Two clips 116 are attached to the second side plate 11b, adjacent to the rear end of the second side plate 11b, and respectively above and below the tab 112. Four of a total eight positioning holes 117 are defined in the first side plate 11a, above the tab 112. Two of the holes 117 are arranged adjacent to the tab 112, the other two holes 117 are arranged respectively adjacent to the front and the rear ends of the first side plate 11a. The other four positioning holes 117 are defined in the first side plate 11a, below the tab 112, and symmetrical to the corresponding positioning holes 117 above the tab 112 relative to the tab 112. Each of the fixing plates 12 defines a plurality of fixing holes 121. Each of the front end plates 13 includes a first segment 131 perpendicularly extending from the first side plate 11a, and a second segment 132 extending rearwards from a distal end of the first segment 131 away from the first side plate 11a. The second segment 132 defines a fixing hole 135. Two positioning slots 136 are respectively defined between every two adjacent front end plates 13. Each of the fixing units 14 includes a first segment 142 perpendicularly extending from the second side plate 11b, and a second segment 144 extending forwards from a distal end of the first segment 142 far away from the second side plate 11b. Each second segment 144 defines a fixing hole 146.

The resilient member 20 is a substantially X-shaped spring strip, and includes a mounting portion 21 and two substantially V-shaped resilient arms 22 extending from opposite ends of the mounting portion 21. Two securing holes 211 are defined in the mounting portion 21. Distal ends of the arms 22 are curled.

Each of the first guiding members 30a includes a pin 31a and a sleeve 33a encircling the pin 31a. The second guiding members 30b are as same as the first guiding members 30a. Each of the guiding members 30b includes a pin 31b and a sleeve 33b encircling the pin 31b.

In assembly, the pins 31a of the first guiding members 30a are respectively secured in the four positioning holes 117 above the tab 112. The pins 31b of the second guiding members 30b are respectively secured in the four positioning holes 117 below the tab 112. The resilient member 20 is mounted to the first side plate 11a, with two fasteners (not labeled) extending through the corresponding securing holes 211 of the mounting portion 21 of the resilient member 20 and fixed in the corresponding connecting holes 1121 of the tab 112.

Referring to FIG. 1 again, the switch cables 300 are attached to the cable management mechanism. Tail portions of the second connectors 302 of the switch cables 300 are clipped by the corresponding clips 116, and head portions of the second connectors 302 are sandwiched between the fixing units 14. The switch cables 300 are attached to the retaining rings 114, with the positioning rings 303 on the switch cables 300 clipped by the retaining rings 114. The switch cables 300 extend through a passage between one first guiding member 30a and one corresponding second guiding member 30b adjacent to the retaining rings 114, respectively resisting against a bottom of the first guiding member 30a and a top of the second guiding member 30b. The switch cables 300 are respectively attached to top and bottom of one of the resilient arms 22 of the resilient member 20, and then respectively sandwiched between the mounting portion 21 of the resilient member 20 and the first and second guiding members 30a and 30b adjacent to the tab 112. The switch cables 300 are also respectively attached to top and bottom of the other resilient arm 22 of the resilient member 20. The switch cables 300 extend through a passage between one first guiding member 30a and one corresponding second guiding member 30b adjacent to the front plates 13, respectively resting against a bottom of the first guiding member 30a and a top of the second guiding member 30b. The switch cables 300 respectively extend through the corresponding positioning slots 136, with the first connectors 301 extending out of the mounting bracket 10. The switch cables 300 extend sinuously along a lengthwise direction of the mounting bracket 10. Furthermore, the switch cables 300 will not abraded by resilient member 20 because the distal ends of the resilient arms 22 are curled.

The mounting bracket 10 is attached to the inside of the sidewall 102 of the chassis 100 with the switch cables 300 arranged between the sidewall 102 and the mounting bracket 10. The first connectors 301 of the switch cables 300 extend out from the front end of the chassis 100. A plurality of fasteners is fixed in the through holes of the bottom wall 101 of the chassis 10, and the corresponding fixing holes 121 of the bottom fixing plate 12. Other fasteners are fixed in the through holes of the sidewall 102 of the chassis 100, and the fixing holes 135 and 146 of the front end plates 13 and the fixing units 14 of the mounting bracket 10. Therefore, the mounting bracket 10 is secured to the base of the chassis 10. The cover 103 is mounted to the base of the chassis 100, and fixed to the mounting bracket 10 with a plurality of fasteners (not labeled) fixed in the through holes of the cover 103 and the corresponding fixing holes 121 of the top fixing plate 12. Because the width of each of the fixing plates 12 is slightly greater than a diameter of each switch cable 100, the switch cables 100 are capable of moving smoothly, and the space occupied by the mounting bracket 10 is as small as possible.

Figure 3:
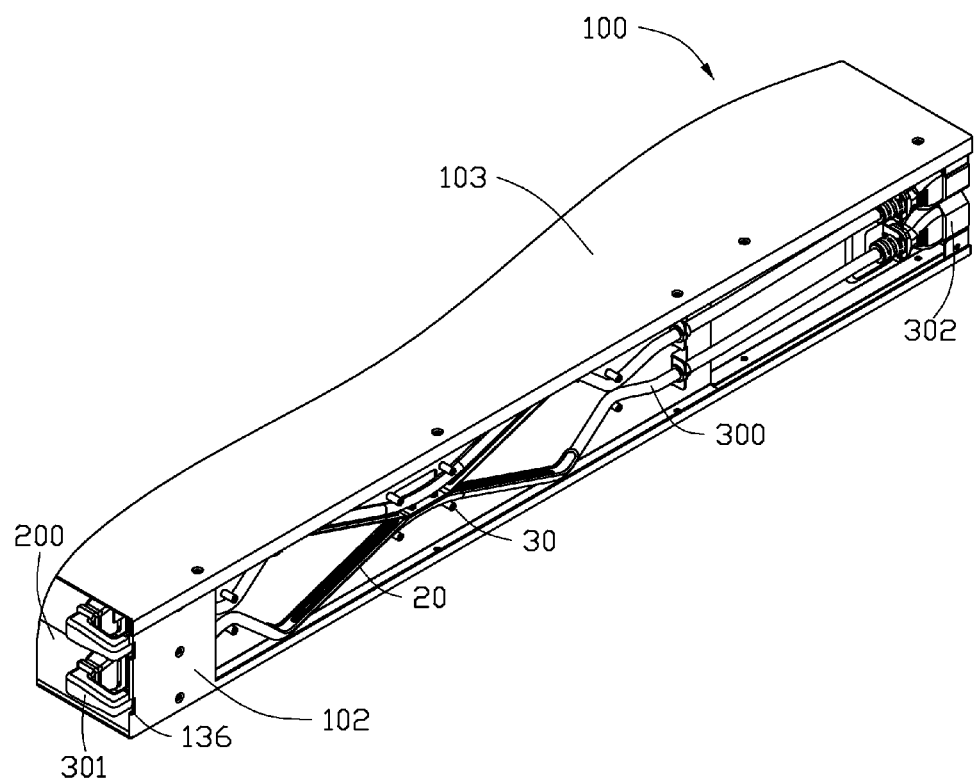
FIG. 3 is assembled view of the cable management mechanism, the switch cables, the chassis, and two power modules.

Referring to FIG. 3, in use, two power modules 200 are slid into the chassis 100 from the front end of the chassis 100, and fixed to the chassis 100. The second connectors 302 of the switch cable 300 are connected to a power source. The first connectors 301 of the power module 200 are correspondingly inserted into and electrically connected to the power modules 200. The switch cables 300 are stretched by the resilient members 20, thereby preventing the switched cables 300 from disengaging from the power modules 200.

Figure 4:
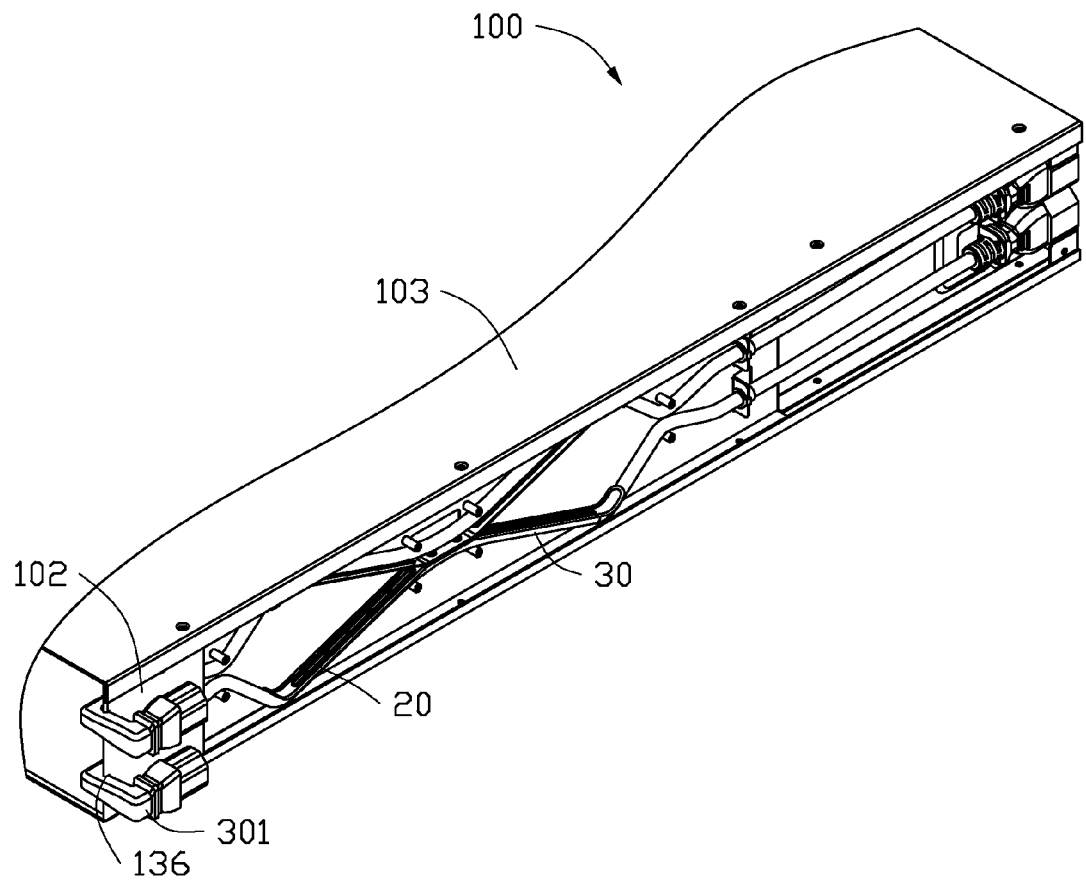
FIG. 4 is similar to FIG. 3, with the power modules removed.

Referring to FIG. 4, to detach the power modules 200, the first connectors 301 are driven forward to be disengaged from the power modules 200. At the same time, the switch cables 300 extend forward to deform the corresponding resilient members 20. The first connectors 301 are rotated to the sidewall 102 of the chassis 100 and correspondingly aligned with the notches 1021 of the sidewall 102. The first connectors 301 are released. The resilient members 20 are restored to draw back the switch cables 300 and engage the first connectors 301 in the corresponding notches 1021 of the sidewall 102 of the chassis 100. The power modules 200 are capable of sliding out of the chassis 100 without interfering with the switch cables 300. The switch cables 300 are received in the mounting bracket 10 of the cable management mechanism and stretched by the resilient members 20. Thus, the switch cables 300 are prevented from interfering with function components in the chassis 100.

The sleeves 33a and 33b of the first and second positioning members 30a and 30b can rotate and not interfere with the movement of the switch cables 300, which prevents the switch cables 300 from being damaged by the first positioning members 30a or the second positioning members 30b.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. An electronic device comprising:
a chassis;
a power module mounted to the chassis, adjacent to a front end of the chassis;
a cable manage mechanism mounted to the chassis, and comprising a mounting bracket, a plurality of positioning members extending from the mounting bracket, and a resilient member secured to the mounting bracket; and
a switch cable mounted to the cable manage mechanism;
wherein the switch cable comprises a first connector arranged at a front end of the switch cable to be connected to the power module, and a second connector arranged at a rear end of the switch cable to be fixed to the mounting bracket; the switch cable is sandwiched between the resilient member and the plurality of positioning members, thereby the switch cable extending sinuously along a lengthwise direction of the mounting bracket; the resilient member resiliently stretches the switch cable; and
wherein the mounting bracket comprises a tab, the resilient member is a substantially X-shaped spring strip, and comprises a mounting portion secured to the tab of the mounting bracket, and two substantially V-shaped resilient arms respectively slantingly extending from opposite ends of the mounting portion, the switch cable extends along the resilient arms.

2. The electronic device of claim 1, wherein the mounting bracket comprises a retaining ring and a clip respectively positioned at a middle and a rear end of the mounting bracket, the switch cable comprises a positioning ring engaged in the retaining ring of the mounting bracket, a tail portion of the second connector of the switch cable is clipped in the clip of the mounting bracket.

3. The electronic device of claim 1, wherein the chassis comprises a bottom wall and a sidewall substantially perpendicularly extending up from a side of the bottom wall, the mounting bracket of the cable management mechanism is attached to an inner side of the sidewall of the chassis, the switch cable is positioned between the mounting bracket of the cable management mechanism and the sidewall of the chassis.

4. The electronic device of claim 3, wherein a notch is defined in a front end of the sidewall to detachably engaging with the first connector of the switch cable.

5. The electronic device of claim 1, wherein each of the positioning members comprises a pin fixed to the mounting bracket, and a sleeve rotatably placed around the pin.

* * * * *